(12) United States Patent
Uda et al.

(10) Patent No.: US 7,285,428 B2
(45) Date of Patent: Oct. 23, 2007

(54) PRODUCTION METHOD OF ELECTRON SOURCE AND IMAGE DISPLAY

(75) Inventors: Yoshimi Uda, Kanagawa-Ken (JP); Kazuya Ishiwata, Kanagawa-Ken (JP)

(73) Assignee: Canon Kabushiki Kaisha, Tokyo (JP)

(*) Notice: Subject to any disclaimer, the term of this patent is extended or adjusted under 35 U.S.C. 154(b) by 401 days.

(21) Appl. No.: 11/038,276

(22) Filed: Jan. 21, 2005

(65) Prior Publication Data

US 2005/0170536 A1 Aug. 4, 2005

(30) Foreign Application Priority Data

Feb. 2, 2004 (JP) ............................. 2004-025455

(51) Int. Cl.
*H01L 21/00* (2006.01)

(52) U.S. Cl. ...................... 438/4; 438/20; 438/940; 257/E21.596

(58) Field of Classification Search .................. 438/4, 438/940; 257/E21.596; 445/2
See application file for complete search history.

(56) References Cited

U.S. PATENT DOCUMENTS

| 6,653,232 | B2 | 11/2003 | Uda et al. ................... 438/669 |
| 6,758,712 | B2 | 7/2004 | Kubo et al. ..................... 445/24 |
| 6,803,707 | B2 | 10/2004 | Ishiwata et al. ............. 313/310 |
| 6,815,884 | B2 | 11/2004 | Yamada et al. .............. 313/495 |
| 6,853,117 | B2 | 2/2005 | Toshima et al. ............. 313/304 |
| 6,856,374 | B1* | 2/2005 | Ozaki et al. ................. 349/192 |
| 6,866,989 | B2 | 3/2005 | Watanabe et al. ............ 430/394 |
| 7,026,648 | B2* | 4/2006 | Lai ............................... 257/72 |
| 2002/0003398 | A1 | 1/2002 | Meguro et al. .............. 313/495 |
| 2003/0060114 | A1 | 3/2003 | Yanagisawa et al. .......... 445/24 |
| 2003/0141523 | A1 | 7/2003 | Watanabe et al. ............ 257/209 |
| 2005/0019707 | A1 | 1/2005 | Watanabe et al. ............ 430/394 |
| 2005/0062391 | A1 | 3/2005 | Toshima et al. ............. 313/310 |
| 2005/0148269 | A1 | 7/2005 | Uda et al. ........................ 445/6 |

FOREIGN PATENT DOCUMENTS

JP 9-266322 A 10/1997

* cited by examiner

*Primary Examiner*—Stephen W. Smoot
(74) *Attorney, Agent, or Firm*—Fitzpatrick, Cella, Harper & Scinto (57) ABSTRACT

In a production method of an electron source wherein a plurality of electron-emitting devices are connected by and driven by matrix wirings, the upper wiring of the matrix wiring is partially removed at a short circuit region at a cross portion between the matrix wirings, thereby removing the short circuit and effectively repairing an electrical connecting relation of the matrix wirings.

8 Claims, 7 Drawing Sheets

PRODUCTION METHOD OF ELECTRON SOURCE AND IMAGE DISPLAY

BACKGROUND OF THE INVENTION

1. Field of the Invention

The present invention relates to a production method of an electron source in which electron-emitting devices are arranged at each cross point of a matrix wiring, and a production method of an image display constituted by using the electron source.

2. Related Background Art

In recent years, in general, as a flat panel display, an image display has been proposed, which comprises an electron source arranging electron-emitting devices of a self-luminous type in the shape of a matrix on a rear plate, and a face plate having a phosphor. Conventionally, broadly classifying the electron-emitting devices, a thermoelectron-emitting device and a cold cathode electron-emitting device have been known, and in the cold cathode electron-emitting device, there are a field emission type (FE type), a metal/insulating layer/metal type (MIM type), a surface conduction electron-emitting device and the like. The surface conduction electron-emitting device allows a current to flow on a thin film of a small area formed on a substrate in parallel with the film surface, thereby generating an electron discharge. As a material of the thin film, $SnO_2$, Au, $In_2O_3/SnO_2$, carbon and the like have been proposed.

Figure 8A:
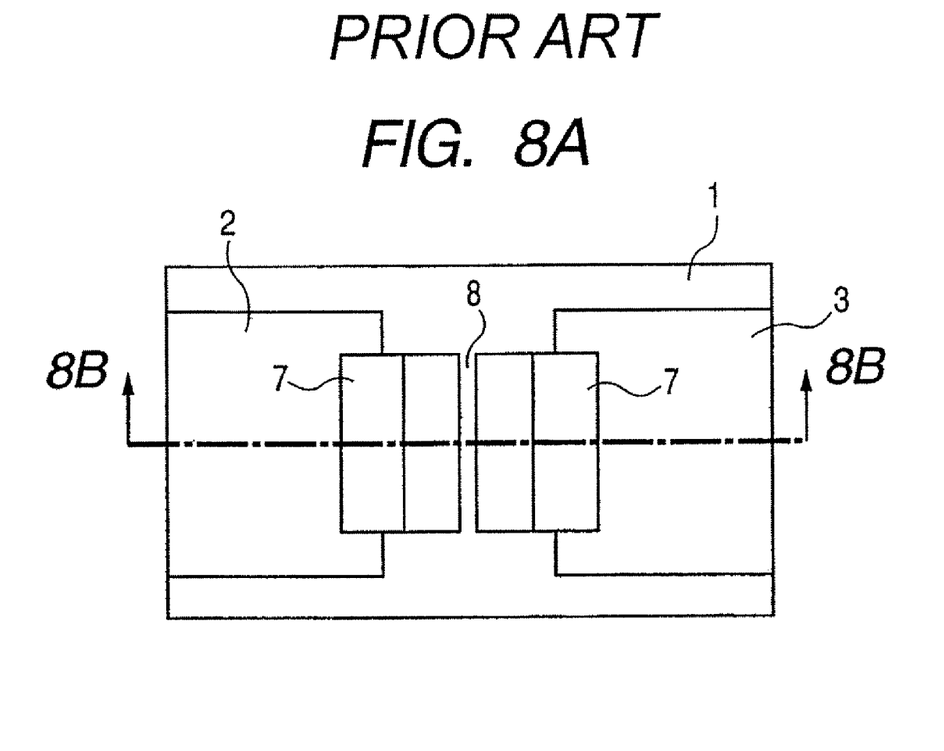
FIGS. 8A and 8B are schematic illustrations of one example of a surface conduction electron-emitting device.
Figure 8B:
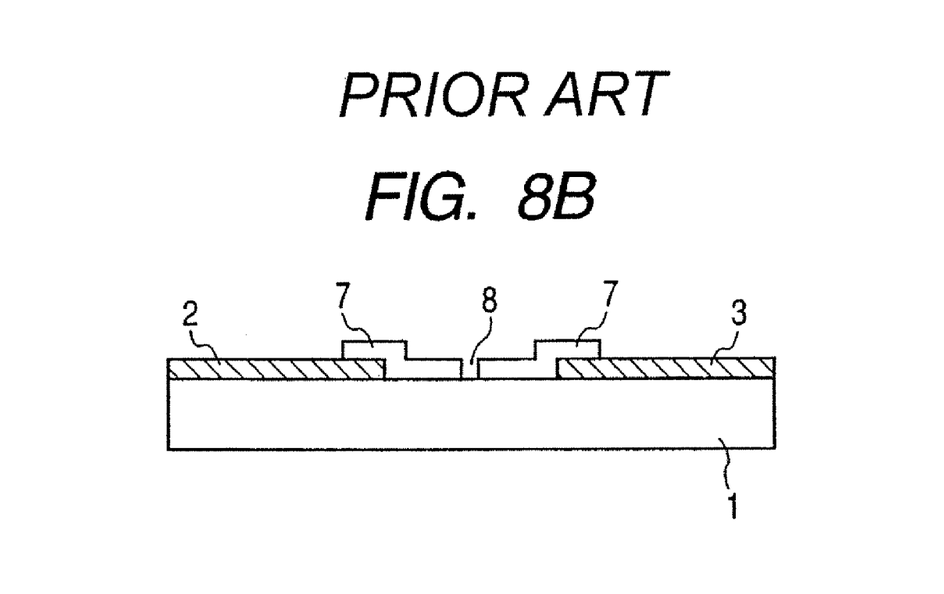

In FIGS. 8A and 8B are schematically shown one structural example of the surface conduction electron-emitting device. In the drawing, reference numeral 1 denotes a substrate, reference numerals 2 and 3 device electrodes, reference numeral 7 a device film, and reference numeral 8 an electron-emitting region. FIG. 8A is a top plan schematic illustration, and FIG. 8B is a cross sectional view cut along the line 8B-8B in FIG. 8A.

The electron-emitting device of FIGS. 8A and 8B are constituted such that the device electrodes 2 and 3 are formed on the substrate 1, and after that, the conductive device films 7 are formed so as to communicate with the device electrodes 2 and 3, and a voltage is applied between the device electrodes 2 and 3 so as to subject the device films 7 to an energization operation referred to as an energization forming, thereby locally breaking, deforming or transforming the device films 7 to form an electron-emitting region 8 having electrically a high resistance.

Figure 9:
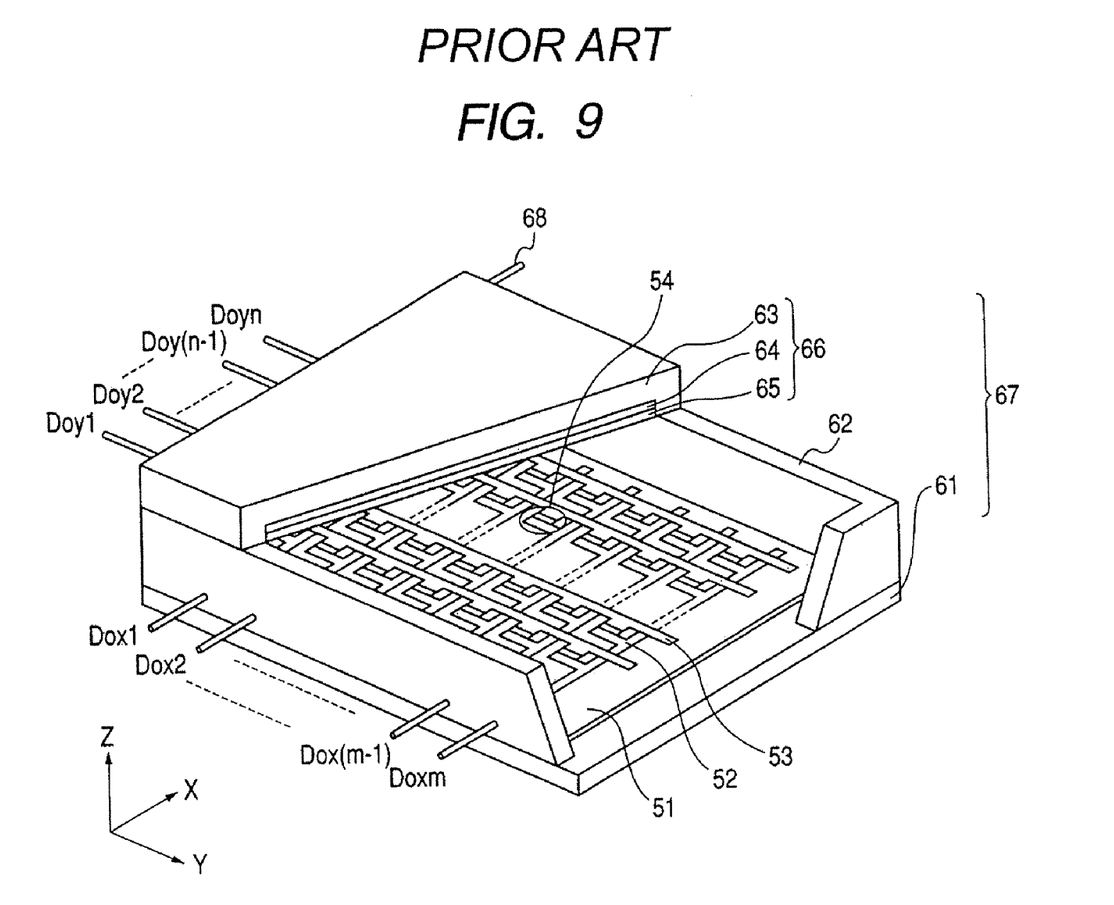
FIG. 9 is a schematic block diagram of a panel of an image display constituted by using an electron-emitting device of FIGS. 8A and 8B.

In FIG. 9 is schematically shown a panel structural example of the image display constituted by using the electron-emitting device of FIGS. 8A and 8B. In the drawing, reference numeral 51 denotes an electron source substrate, reference numeral 52 a X direction wiring, reference numeral 53 a Y direction wiring, reference numeral 54 an electron-emitting device, reference numeral 61 a rear plate, reference numeral 62 a support frame, reference numeral 63 a glass substrate, reference numeral 64 a fluorescent screen, reference numeral 65 a metal back, reference numeral 66 a face plate, reference numeral 67 an envelope, and reference numeral 68 a high voltage power supply.

In the image display in which the electron-emitting devices 54 of the self-luminous type as shown in FIG. 9 are arranged in the shape of a matrix on the rear plate 61, the X direction wirings 52 and the Y direction wirings 53 are provided to supply a power to a plurality of electron-emitting devices 54, and in the cross point of the respective wirings, there is arranged an insulating layer (not shown) at least to prevent both of the wirings from being electrically short-circuited.

In such an image display, in the cross point of the X direction wiring and the Y direction wiring, there are often the cases where a short circuit occurs between the wirings located up and down through the insulating layers. The place where the short circuit occurs is consequentially repaired. For example, though different from the wiring form of the image display, as a repairing example in case a short circuit occurs on a conductive layer located up and down through a semiconductor layer, a repairing method by laser has been proposed in Japanese Patent Application Laid-Open No. H09-266322.

However, even when an attempt is made to appropriate the repairing method as it is which is disclosed in Japanese Patent Application Laid-Open No. H09-266322 for the repairing of the short circuit between up and down wirings in the above described image display, a time utility in the repairing operation is low, and when an effort is made to improve the time utility, there are often the cases where such an effort results in many short circuit regions to still remain.

SUMMARY OF THE INVENTION

The object of the present invention is to provide a production method comprising a step of effectively repairing a short circuit region in the cross point of a matrix wiring in an image display constituted by using an electron source driving a plurality of electron-emitting devices in the matrix wiring and the electron source.

DESCRIPTION OF THE PREFERRED EMBODIMENTS

A first aspect of the present invention is a production method of an electron source comprising: a plurality of upper layer wirings; a plurality of lower layer wirings crossing the upper layer wirings through insulating layers; and a plurality of electron-emitting devices connected to the upper layer wirings and the lower layer wirings, respectively, and is characterized by comprising a step of forming the lower layer wirings, the insulating layers, and the upper layer wirings on a substrate, and after that forming step, a step of removing a partial region of said upper layer wiring including a region of short circuiting between said lower and upper layer wirings within a region in which said lower layer wiring crosses said upper layer wiring, wherein the partial region to be removed of the upper layer wiring extends beyond both edges of the lower layer wiring in a width direction of the lower layer wiring, but does not extend beyond at least one edge of the upper layer wiring in the width direction of the upper layer wiring.

In the present invention, the following constitution is included as a preferable mode.

The step of removing a partial region of the upper layer wiring is to perform a laser irradiation on that partial region. Particularly, the laser irradiation is performed in several times. Alternately, the outer peripheral portion of a beam spot is smaller than the inner side portion in output. Alternately, during the period of time performing the laser irradiation, the beam spot of the laser to irradiate is changed at least not less than one time.

The removing step of the upper layer wiring is a mechanical cutting step.

The removing step of the upper layer wiring is a step of performing a laser irradiation after the mechanical cutting.

A second aspect of the present invention is a production method of the image display comprising an electron source comprising: a plurality of upper layer wirings; a plurality of lower layer wirings crossing the upper layer wirings through insulating layers; and an electron-emitting device comprising a device electrode connected to each wiring in each cross point with the upper layer wiring and the lower layer wiring; and a light emitting material for emitting a light by collision of electrons discharged from the electron-emitting device, wherein an electron source is produced by a production method of the electron source of the present invention.

The present invention can effectively and relatively reliably remove a short circuit region with the lower layer wiring.

Hence, according to the present invention, an image display having a high reliability can be effectively produced and provided at a more affordable price.

While an embodiment of the present invention will be illustratively described below in detail, it is to be expressly understood that a dimension, a material, a shape, a relative configuration, and the like described in the embodiment is not limited to the range described below unless described otherwise.

Figure 1:
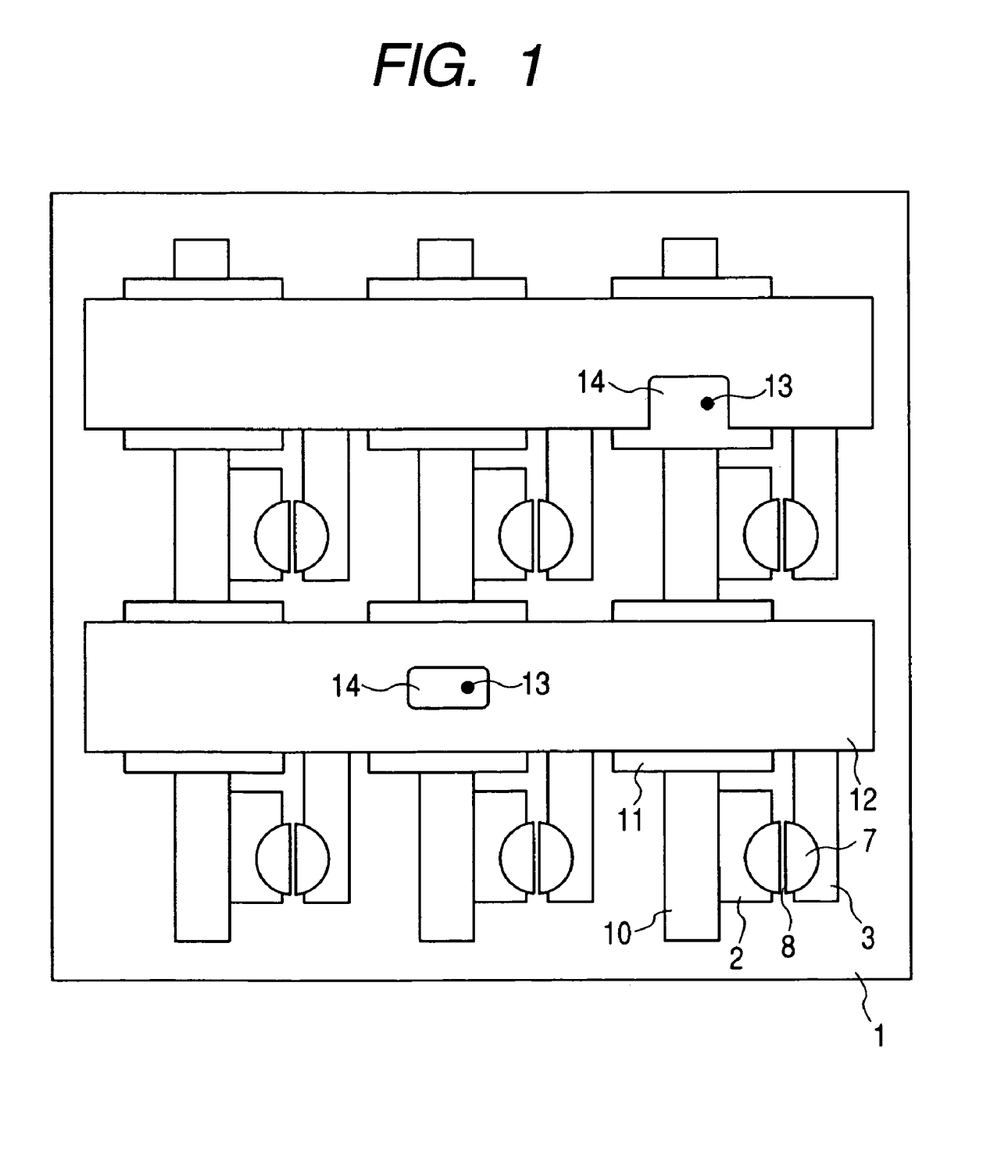
FIG. 1 is a top plan schematic illustration of one example of an electron source produced by a production method of the present invention.

FIG. 1 is a top plan schematic illustration of one example of an electron source produced by a production method of the present invention. In the drawing, reference numeral 1 denotes a substrate, reference numerals 2 and 3 a device electrode, reference numeral 7 a device film, reference numeral 8 an electron-emitting region, reference numeral 10 a lower layer wiring, reference numeral 11 an insulating layer, reference numeral 12 an upper layer wiring, reference numeral 13 a short circuit region occurred in the insulating layer 11, and reference numeral 14 a region (repair region) having partially removed the upper layer wiring 12 for repairing.

The electron source produced by the production method of the present invention comprises a plurality of lower layer wirings 10 and a plurality of upper layer wirings 12, which cross the lower layer wirings 10 through the insulating layers 11, on the substrate 1, and comprises an electron-emitting device having device electrodes 2 and 3 connected to each wiring in the cross region with the upper layer wiring 12 and the lower layer wiring 10. Each electron-emitting device comprises the device electrodes 2 and 3, and the device film having an electron-emitting region 8.

Figure 2A:
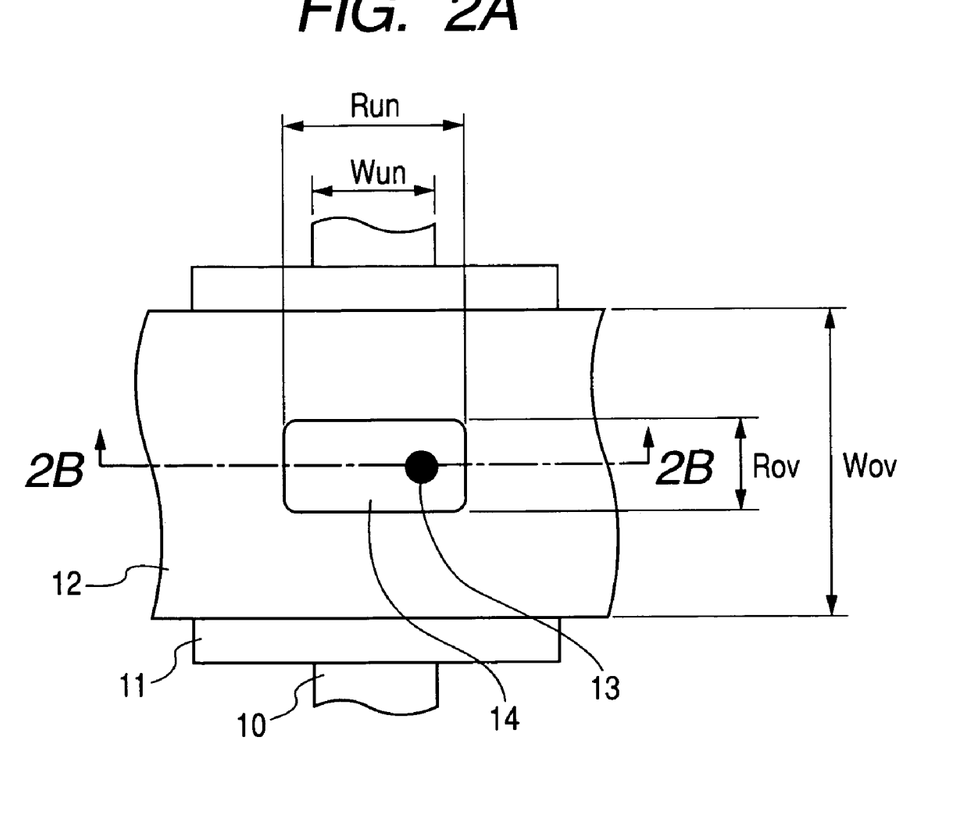
FIGS. 2A and 2B are partially enlarged views of a repair region of FIG. 1.
Figure 2B:
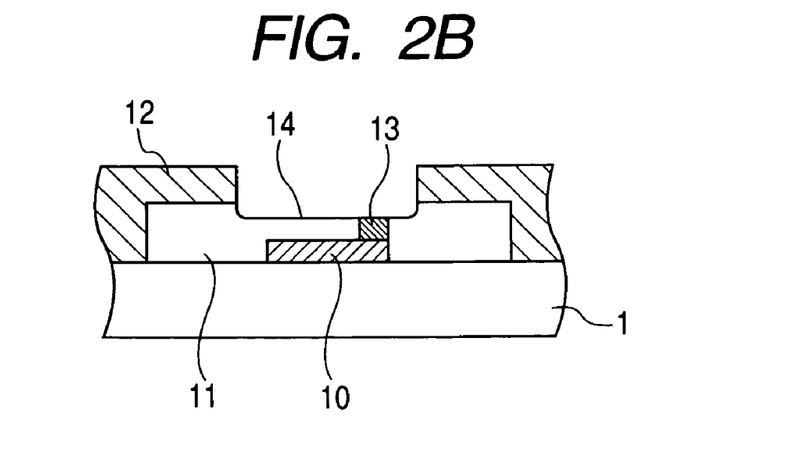
Figure 3:
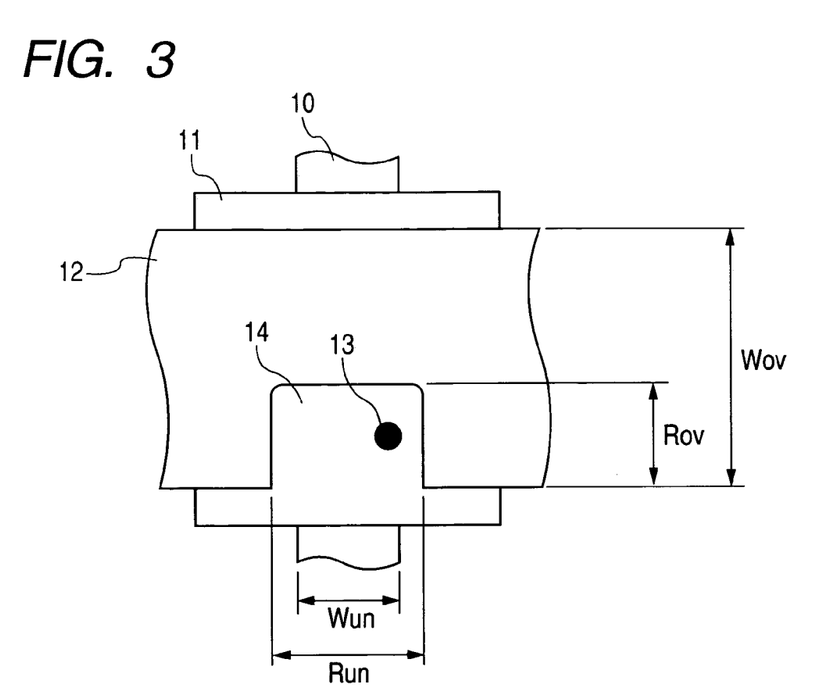
FIG. 3 is a partially enlarged view of a repair region of FIG. 1.

In the electron source of FIG. 1, a partially enlarged view of the periphery including the repair region 14 of a cross region with a center column in the upper layer wiring 12 and the lower layer wiring 10 of the lower echelon is shown in FIGS. 2A and 2B, and an enlarged view of the periphery including the repair region 14 of a cross region with a right column in the upper layer wiring 12 and the lower layer wiring 10 of the upper echelon is shown in FIG. 3, respectively. In FIGS. 2A, 2B and 3, the member relating to the electron-emitting device is omitted. In FIGS. 2A and 2B, FIG. 2B is a cross sectional view cut along the line 2B-2B in FIG. 2A.

As shown in FIGS. 2A and 2B, the repair region 14 according to the present invention is a region in which the insulating layer 11 is exposed by partially removing the upper layer wiring 12.

In the present invention, the maximum width Rov in a width direction of the upper layer wiring 12 of the repair region 14 is smaller than a width Wov of the upper layer wiring 12. That is, as shown in the drawing, since the repair region 14 does not cross over at least the one edge portion of the upper layer wiring 12 in the width direction of the upper layer wiring 12, there is no possibility of the upper layer wiring 12 to be disconnected in the repairing step. Further, in the present invention, the maximum width Run in the width direction of the lower layer wiring 10 of the repair region 14 is larger than a width Wun of the lower layer wiring 10. That is, as shown in the drawing, since the repair region 14 crosses both edges of the lower layer wiring 10 in the width direction of the lower layer wiring 10, an electrical shut off with the short-circuit region 13 and the upper layer wiring 12 is definitely performed by the repairing. In FIGS. 2A, 2B and 3, Rov<Wov, and moreover, Run≧Wun.

In the present invention, as a specific means of the repairing step, a method by a laser irradiation and a mechanically cutting method can be cited.

In case the upper layer wiring 12 in the short-circuit region is partially removed by the laser irradiation, to satisfy a regulation of the width of the repair region 14 according to the present invention, it is preferable that the laser irradiation is divided into plural times, and is intermittently performed. A repeated frequency is preferably below 1000 Hz. In this case, laser energy per unit of time thrown into the upper layer wiring 12 to be removed can be made small.

Further, when the laser irradiation is performed in plural times, it is desirable that the output of the outer peripheral portion (region of 5 to 10% toward the center from the outer most periphery) of the beam spot of the laser be made more controlled than the output of the inner side portion. In this way, by adjusting the output with the outer peripheral portion and the inner side portion of the spot, the laser energy per unit of time thrown into the boundary portion of the repair region 14 can be made smaller than the inner side portion of the repair region 14.

Further, during plural times of the laser irradiation, the beam spot is changed at least for one time, so that the laser energy per unit of time thrown into the boundary portion of the repair region 14 can be made smaller than the inside portion of the repair region 14.

Further, in case the upper layer wiring 12 in the short-circuit region is partially removed by the mechanical cutting, a keen-edged blade tool can be used. As shown in FIG. 3, in case the repair region 14 is close to the end portion in the width direction of the upper layer wiring 12, a working process is easier than the case where the region 14 is close to the center portion in the width direction of the upper layer wiring 12 as shown in FIGS. 2A and 2B, and this is suitable for the mechanical cutting.

In the present invention, after the above described mechanical cutting step, a laser irradiating step is performed, so that a sharp edge of the boundary portion of the repair region 14 can be worked so as to become round. Further, the mechanical cutting and the laser irradiation can be mixed and executed.

Figure 4:
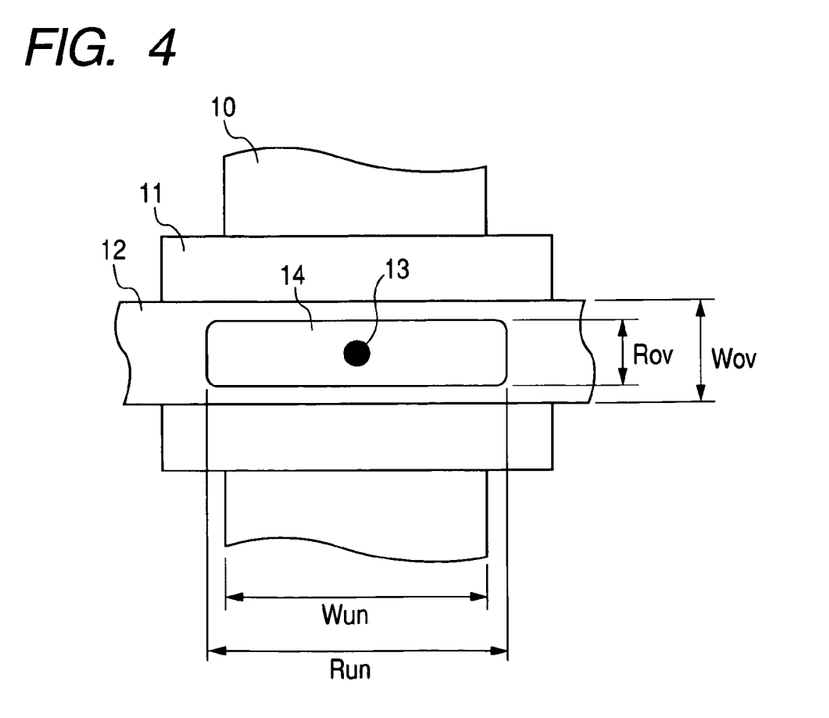
FIG. 4 is a view showing the repair region in a matrix wiring in which an upper layer wiring is narrower than a lower layer wiring.

In FIGS. 1 to 3, though a configuration where the width Wov of the upper layer wiring 12 is wider than the width Wun of the lower layer wiring 10 is shown, in the present invention, as shown in FIG. 4, Wun may be >Wov, and in the present configuration also, Run≧Wun and Rov<Wov, and as shown in FIG. 4, since the repair region 14 does not cross over the edge portion of at least the one side of the upper layer wiring 12 in the width direction of the upper layer wiring 12, there is no possibility of the upper layer wiring 12 to be disconnected in the repairing step, and further, since the repair region 14 crosses both edges of the lower layer wiring 10 in the width direction of the lower layer wiring 10, the electrical shut down with the short circuit region 13 and the upper layer wiring 12 is definitely performed by the repairing.

Further, in FIGS. 1 to 3 are shown a configuration where the upper layer wiring 12 and the lower layer wiring 10 are orthogonal to each other, but the present invention is not limited to this, and includes a configuration also in which the upper layer wiring 12 and the lower layer wiring 10 obliquely cross each other in a design point of view. This will be concretely shown in FIGS. 5 and 6. In whichever configurations, Run≧Wun and Rov<Wov, and similarly to each example as described above, as shown in FIGS. 5 and 6, since the repair region 14 does not cross the edge portion of at least the one side of the upper layer wiring 12 in the width direction of the upper layer wiring 12, there is no possibility of the upper layer wiring 12 to be disconnected in the repairing step, and further, since the repair region 14 crosses both edges of the lower layer wiring 10 in the width direction of the lower layer wiring 10, the electrical shut off with the short circuit region 13 and the upper layer wiring 12 is definitely performed by the repairing.

Figure 5:
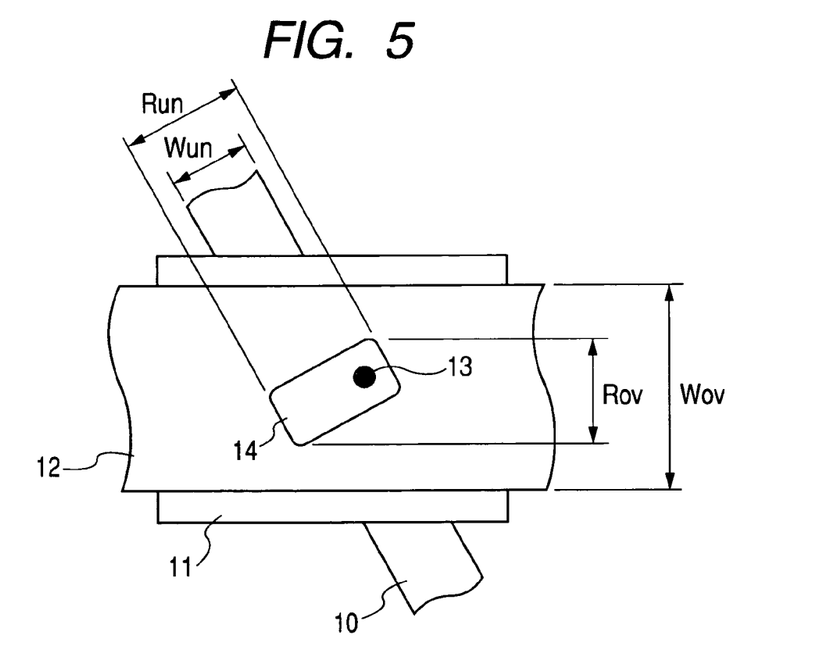
FIG. 5 is a view showing the repair region in the matrix wiring in which an upper layer wiring and a lower layer wiring are inclined and crossed.
Figure 6:
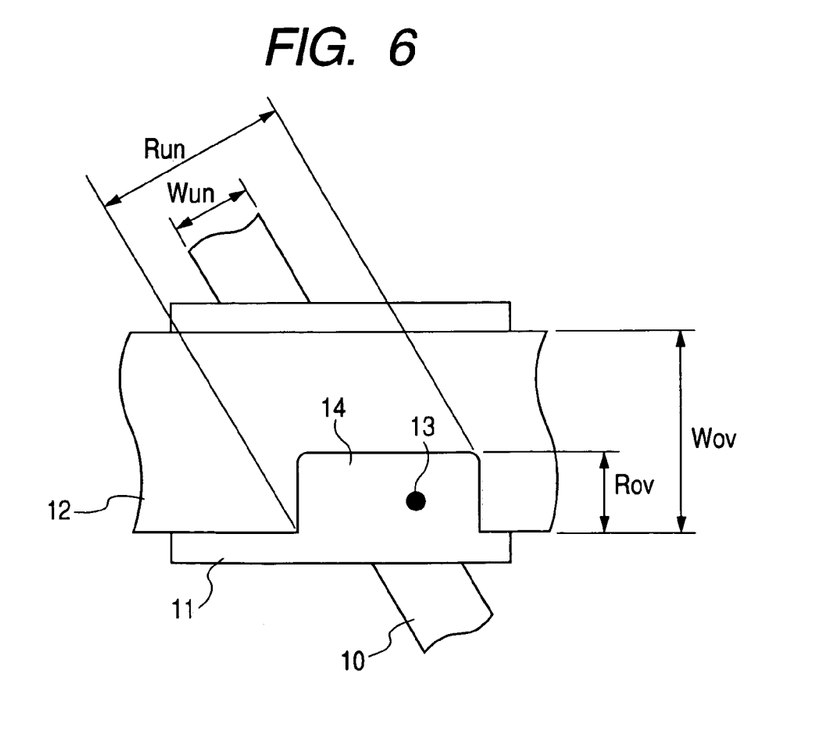
FIG. 6 is a view showing the repair region in the matrix wiring in which an upper layer wiring and a lower layer wiring are inclined and crossed.

In the present invention, the shape of the repair region 14 is not limited to an approximate rectangular shape such as FIGS. 1, 2A, 2B, 4 and 5, and an approximate rectangular notched shape such as FIGS. 3 and 6, but for example, a broadly interpreted circular shape such as an approximate oval shape, a broadly interpreted quadrangular shape such as an approximate-trapezoid shape and an approximate parallelogram shape, and the like, and a broadly interpreted polygonal shape, or an arbitrary shape combining the shapes as described above can be also applicable.

Further, the repairing step according to the present invention may be performed after the formation of the device electrodes 2 and 3, the lower layer wiring 10, the insulating layer 11, and the upper layer wiring 12 prior to the formation of the device film 7, but it is not limited to this, and is executed when the lower layer wiring and the upper layer wiring are short-circuited. Consequently, it is not subjected at all to the timing of the formation of the device electrodes 2 and 3, the device film 7, and the like, and has nothing to do with the timing.

While the electron source produced by the present invention and each member of the image display will be illustratively described below, the dimension, the material, the shape, the relative configuration of the members described in the embodiment will not be limited to the range as described below unless described otherwise.

As a base plate 1, a silica glass, a glass reduced in impurity content such as Na and the like, a soda lime glass, a glass base plate laminated with $SiO_2$ which is formed on the soda lime glass by a sputtering method, ceramics such as aluminum and the like, and a Si base plate and the like can be used.

As the device electrodes 2 and 3, a prevalent conductive material can be used. This material can be, for example, adequately selected from a printed conductor constituted from a metal or an alloy such as Ni, Cr, Au, Mo, W, Pt, Ti, Al, Cu, Pd and the like, and a metal or a metallic oxide such as Pd, Ag, Au, $RuO_2$, Pd—Ag, and the like, a glass and the like, a transparent conductive material such as $In_2O_3$—$SnO_2$ and the like, and a semiconductor material such as a polysilicon and the like.

The material which constitutes the device film 7 can be adequately selected from among a metal such as Pd, Pt, Ru, Ag, Au, Ti, In, Cu, Cr, Fe, Zn, Sn, Ta, W, Pb and the like, an oxide such as PdO, $SnO_2$, $In_2O_3$, PbO, $Sb_2O_3$ and the like, a boride such as $HfB_2$, $ZrB_2$, $LaB_6$, $CeB_6$, $YB_4$, $GdB_4$, and the like, a carbide such as TiC, ZrC, HfC, TaC, SiC, WC and the like, a nitride such as TiN, ZrN, HfN and the like, a semiconductor such as Si, Ge and the like, and carbon and the like.

The electron-emitting region 8 is constituted by a fissure of high resistance formed by subjecting the device film 7 to a conducting process, and depends on a film thickness, a film quality, a material and a conducting process condition of the device film 7 and the like.

While the electron-emitting device of FIGS. 8A and 8B form the device electrodes 2 and 3, and after that, forms the device film 7, the present invention may be constituted such that the device film 7 is formed, and after that, the device electrodes 2 and 3 are formed.

In the production method of the electron source of the present invention, the lower layer wiring 10 and the upper layer wiring 12 can be constituted by the conductive metal and the like formed by using a vacuum evaporation method, a printing method, a sputtering method and the like. The material, the film thickness and the width of the wiring are adequately designed. Further, the insulating layer 11 which isolates the lower layer wiring 10 and the upper layer wiring 12 is constituted by $SiO_2$ and the like formed by using the vacuum evaporation method, the printing method, the sputtering method and the like. The lower layer 10 is equivalent to a X direction wiring 52 in FIG. 9 and the upper layer wiring 12 to a Y direction wiring 53, and can be pulled out as an external terminal Dox1-Doxm and Doy1-Doyn, respectively.

The X direction wiring 52 is connected to unillustrated scan signal applying means of applying a scan signal for selecting the line of electron-emitting devices 54 arranged in the X direction to. In the meantime, the Y direction wiring 53 is connected to unillustrated modulating signal generating means of modulating each column of the electron-emitting devices 54 arranged in the Y direction according to inputted signals. The driving voltage applied to each electron-emitting device is supplied as a differential voltage with a scan signal and a modulation signal applied to the device.

In FIG. 9, reference numeral 51 denotes an electron source substrate in which the electron-emitting device 54 is arranged in plurality, reference numeral 61 a rear plate in which the electron source substrate 51 is fixed, and reference numeral 66 a face plate (image forming member) in which a phosphor film 64 comprising a luminous body such as a phosphor and the like and a metal back 65 as an anode electrode are formed on the inner surface of a glass substrate 63. Reference numeral 62 denotes a support frame, and the support frame 62 is connected to the rear plate 61 and the face plate 66 by using a frit glass and the like. Reference numeral 67 denotes an envelope, which is, for example, sealed and constituted by being baked in the atmosphere or in nitrogen in the temperature range of 400 to 500° C. for more than ten minutes.

The envelope 67, as described above, is constituted by the face plate 66, the support frame 62, and the rear plate 61. Since the rear plate 61 is provided mainly for reinforcing the strength of the substrate 51, in case the substrate 51 itself has a sufficient strength, the rear plate 61 of another substrate can be dispensed. That is, the substrate 51 is directly sealed in the support frame 62, and the face plate 66, the support frame 62 and the substrate 51 may constitute the envelope 67. In the meantime, by providing an unillustrated support body referred to as a spacer between the face plate 66 and the rear plate 61, the envelope 67 having a sufficient strength for the atmosphere can be constituted.

The image display according to the present invention can be used as a display for a television broadcast, a display for a television conference, a computer and the like, and in addition, as a display and the like as an optical printer constituted by using a photosensitive drum and the like.

First Embodiment

The matrix wiring of the electron source shown in FIG. 1 was prepared. In the present example, the size of one pixel was taken as 205 μm in a horizontal direction and 615 μm in a longitudinal direction, and the width Wun of the lower layer wiring 10 was taken as approximate 50 μm and the thickness thereof as approximate 20 μm, and the width of the insulating layer 11 in a width direction of the upper layer wiring 12 was taken as approximate 470 μm and the thickness thereof as approximate 40 μm, and the width Wov of the upper layer wiring 12 was taken as approximate 380 μm and the thickness thereof as approximate 8 μm, and the device electrodes 2 and 3 were effectively arranged in that pixel size. The thickness of the device electrodes 2 and 3 was approximate 0.05 μm. The production process will be described below in detail.

On the glass substrate 1, which is mainly composed of a glass, (PD200 is used, in which an alkaline component is suppressed from a soda lime glass), first, a Pt film with Ti as an underlay was deposited, and the device electrodes 2 and 3 were formed so as to have a desired shape by photolithography and an etching method.

Figure 7:
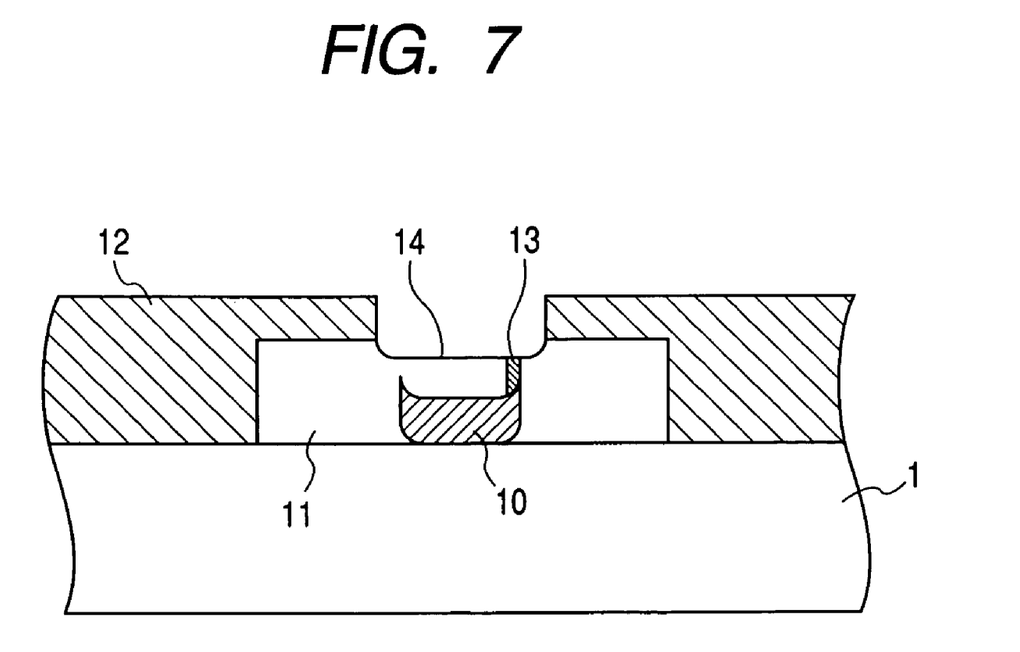
FIG. 7 is a cross sectional schematic illustration of the cross region of the matrix wiring prepared by an first embodiment.

Next, by using a photosensitive paste which contains a small quantity of PbO based glass with Ag as a major constituent, a film deposition (screen process printing), an exposure (photo mask of a negative film having a lower layer wiring pattern), a developing (developing solution adding an purified water with an approximate 4% of sodium carbonate), and an baking (480° C.) were performed, thereby forming the lower layer wiring 10. In this state, the device electrode 2 was brought into contact with the lower layer wiring 10, and an electrical continuity was established. The cross section in a width direction of the lower layer wiring 10 at this time, as shown in FIG. 7, was put into a state where the edges above both end portions were curl-shaped (that is, an edge-curl).

Next, by using the photosensitive paste with PbO and $B_2O_3$ glass as major constituents, a film deposition (screen process printing), an exposure (photo mask of a negative film having an insulating layer pattern), a developing (developing solution adding an purified water with an approximate 4% of sodium carbonate), and an baking (480° C.) were performed, thereby forming the insulating layer 11.

By using a photosensitive paste which contains a small quantity of PbO based glass with Ag as a major constituent, a screen process printing (using a screen printing plate having an upper layer pattern) and a baking (480° C.) were performed, thereby forming the upper layer wiring 12. In this state, an electrical continuity was adequately established with the lower layer wiring 10 and the upper layer wiring 12 formed on the substrate 1, and resistance values thereof were compared, and by adequately observing (by an optical technique and the like), a short circuit region was searched and specified.

In the present example, as shown in FIG. 1, there were the short circuit regions at two places. As shown in the present example, in the lower layer wiring 10 which uses the photosensitive paste, generally due to a few occurrences of the edge curl, a probability of the lower layer wiring 10 and the upper layering wiring 12 to be short circuited is great in both end portions of the width direction of the wiring which is locally elevated in height, and in the present example also, the short circuit occurred at those end portions. The short circuit region was subjected to the repairing step.

For the short circuit region, the size of the beam spot was set in such a manner that the size of the repair region 14 eventually satisfies the requirement of the maximum width according to the present invention. To be specific, since the width Wun of the lower layer wiring 10 was 50 μm, the size of the beam spot in the width of the lower layer wiring was taken as 80 μm, and since the width Wov of the upper layer wiring 12 was 380 μm, the size of the beam spot in the width direction of the upper layer wiring was taken as 100 μm, and the laser (YAG second higher harmonic wave: wavelength $\lambda=532$ nm) was irradiated in plural times in the shape of a pulse. The laser was a pulse excitation system laser with a Q switch, and the Q switch frequency was set at 1 Hz, and an average output was taken approximately as $5\times10^{-4}$ W, and an energy density was taken approximately as $3\times10$ $J/cm^2$, and the upper layer wiring 12 including a portion of the insulating layer 11 was partially removed. The size of the repair region was 70 μm in the maximum width Run in the width direction of the lower layer wiring, and 90 μm in the maximum width Rov in the width direction of the upper layer wiring, and as shown in FIGS. 2 and 3, and it was a rectangle having parallel sides in the width direction of the upper layer wiring and in the width direction of the lower layer wiring, respectively.

The reason why the size of the repair region 14 eventually becomes one size smaller for the beam spot is because, when the upper layer wiring 12 is partially removed by the laser, at the end portion of the upper layer wiring 12 which is the boundary portion of a portion to be removed, the Ag particles of the wiring which are an aggregation of the Ag particle (particle size of approximately 0. several μm to+several μm) are melted by instantaneous heating and cooling by a laser, and become a bulk-shaped Ag, so that the thermal conductivity thereof is improved, and it gradually becomes difficult to process the bulked Ag by an irradiated laser energy, and as a result, the processing size thereof becomes small little by little.

As described above, according to the method in which the laser is used for the repairing step and the short circuit region of the upper layer wiring is cut out to a desired size by the application of the pulse in several times, it is believed that, by a rapid heating by the laser and a length of repeating cycle, the heat is taken out until the next laser irradiation, and therefore, even in a thick film wiring similarly to the electron source using the surface conduction electron-emitting device, it is possible to make a working process up to the insulating layer, and moreover, by regulating the working size, the short circuit region prone to occur at both end regions in the width direction of the lower layer wiring 10 due to the influence of the curl edges of the lower layer wiring can be effectively and reliably removed.

Further, by the action which makes the processing size small little by little by irradiating the laser in plural times, it was possible to control a protrusion of the wiring material after the working process occurred to the upper layer wiring end portion which is the boundary portion of the repair region 14. In case the laser was continuously irradiated, (comparing to a continuous excitation system laser with a YAG second higher harmonic wave (wavelength $\lambda$=532 nm) Q switch in which the repeated frequency is higher than several hundred Hz with a Q switch frequency of 1 kHz, a beam width of 40 µm×40 µm, and an average output of approximate $7\times10^{-2}$, and an energy density of approximate 4 J/cm$^2$) there was an effect of controlling the occurrence of a stray emission.

Second Embodiment

In the beam spot of a size (80 µm×80 µm), a repairing step was performed similarly to the first embodiment except that adjustment was made in such a manner that the outer peripheral portion has an output distribution to control the output by 5 to 50% from the inner side. As a result, the size of the repair region 14 became such that the maximum width Run was 65 µm in the width direction of the lower layer wiring and the maximum width Rov in the width direction of the upper layer wiring was 65 µm. The reason why the size of the repair region is small for the size of the beam spot is believed due to the fact that the thermal conductivity of the Ag is improved similarly to the first embodiment and the output of the outer peripheral portion of the beam spot has been controlled.

In the present example, by controlling the output of the outer peripheral portion of the beam spot, the effect of controlling the protrusion of the wiring material occurred to the upper layer wiring end portion was further enhanced than the first embodiment. Hence, the occurrence of the stray emission could be more favorably controlled.

Third Embodiment

The repairing step was performed similarly to the first embodiment except that the spot size in the width direction of the lower layer wiring was taken as 80 µm, and the spot size in the width direction of the upper layer wiring was taken as 100 µm, and the laser irradiation was performed in plural times in the shape of a pulse, and after that, the spot size in the width direction of the lower layer wiring was changed to 70 µm, and the spot size in the width direction of the upper layer wiring was changed to 90 µm, and the laser irradiation was performed several times in the shape of a pulse, thereby forming the repair region 14. The size of the obtained repair region 14 was such that the maximum width Run in the width direction of the lower layer wiring was 60 µm, and the maximum width Rov in the width direction of the upper layer wiring was 80 µm.

In this way, at the starting time of the repairing step, the spot size of the laser beam was taken as 80 µm×100 µm, and halfway through the repairing step, it was changed to 70 µm×90 µm, so that the effect of controlling the protrusion of the wiring material occurred to the upper layer wiring end portion was further enhanced than the first embodiment. Hence, the occurrence of the stray emission could be more favorably controlled.

Fourth Embodiment

By the spot size (80 µm×100 µm) similarly to the first embodiment, the laser irradiation was performed in plural times, and moreover, the same output distribution as the second embodiment was allowed to carry, and further, halfway through the step, similarly to the third embodiment, the spot size (70 µm×90 µm) was changed so as to perform the repairing step. As a result, the size of the obtained repair region 14 was 55 µm×75 µm.

In the present example, the output distribution of the laser beam and the change of the spot size were combined, so that the effect of controlling the protrusion of the wiring material occurred to the upper layer wiring end portion was enhanced further than the second and third embodiments. Hence, the occurrence of the stray emission could be more favorably controlled.

Fifth Embodiment

The short circuit region of a matrix wiring prepared similarly to the first embodiment was subjected to the repairing step by the mechanical cutting method. To be specific, the short circuit region of the upper layer wiring 12 was cut and removed by using a cutting tool similarly to a cutter knife used as a stationary in general but with the top end thereof sharp edged, so that the maximum width Run in the width direction of the lower layer wiring of the repair region 14 became approximately 100 µm, and the maximum width Rov in the width direction of the upper layer wiring approximately 100 µm. As a result, the repair region 14 was effectively formed.

Sixth Embodiment

The cutting and removal of the short circuit region of the matrix wiring prepared similarly to the first embodiment was performed by the cutting tool, and after that, a laser adjusted to have a beam width one size larger than the repair region by the cutting tool was irradiated on a micro protrusion of the edge of the boundary portion in the repair region 14, and while a portion of the upper layer wiring 12 was being removed, the tip end of the protrusion was processed so as to become round. As a result, the repair region 14 in which the edge was processed to become round with a size of approximate 100 µm×100 µm was obtained. Hence, the occurrence of the stray emission could be more favorably controlled.

Seventh Embodiment

As shown in FIG. 4, a matrix wiring was prepared similarly to the first embodiment except that the wiring width was reversed from the first embodiment such that the width Wun of the lower layer wiring 10 was taken 380 µm and the width Wov of the upper layer wiring 12 was taken as 50 µm, and the repairing step was performed similarly to the first to fourth embodiments and the sixth embodiment so that Run becomes 420 µm and Rov becomes 30 µm with respect to the short circuit region. As a result, a favorable repair region 14 similarly to each embodiment was obtained for either width, and the occurrence of the stray emission could be controlled.

Eighth Embodiment

As shown in FIGS. 5 and 6, a matrix wiring was prepared in which the width Wun of the lower layer wiring 10 was taken as 50 µm, and the width Wov of the upper layer wiring 12 was taken 380 µm, and an angle made by the lower layer wiring 10 and the upper layer wiring 12 was 30°, and the short circuit region was subjected to the repairing step similarly to the first to fourth embodiments and the sixth embodiment so that Run became at least equal to or more than 50 µm and approximate 70 µm and Rov became at least equal to or less than 380 µm and approximate 120 µm. As a result, a favorable repair region 14 similarly to each embodiment for either width was obtained, and the occurrence of the stray emission could be controlled.

This application claims priority from Japanese Patent Application No. 2004-025455 filed on Feb. 2, 2004, which is hereby incorporated by reference herein.

What is claimed is:

1. A production method of an electron source comprising a plurality of upper layer wirings, a plurality of lower layer wirings crossing the upper layer wirings and being spaced from the upper layer wirings by insulating layers, and a plurality of electron-emitting devices connected to the upper layer wirings and the lower layer wirings, respectively, said production method of an electron source comprising:
    a forming step, of forming the lower layer wirings, the insulating layers, and the upper layer wirings on a substrate; and
    a removing step of, after said forming step, removing a partial region of the upper layer wiring including a region of short circuiting between the lower and upper layer wirings within a region in which the lower layer wiring crosses the upper layer wiring,
    wherein the partial region of the upper layer wiring that is to be removed extends beyond both edges of the lower layer wiring in a width direction of the lower layer wiring, but does not extend beyond at least one edge of the upper layer wiring in the width direction of the upper layer wiring.

2. The production method of claim 1, wherein said removing step includes performing a laser irradiation on the partial region.

3. The production method of claim 2, wherein said laser irradiation is performed at plural times.

4. The production method of claim 2, wherein a beam spot used in performing said laser irradiation is changed one or more times during a period in which said laser irradiation is performed.

5. A production method of claim 2, wherein said removing step is performed by means of mechanical cutting, and wherein said laser irradiation is performed after the mechanical cutting.

6. A production method of an electron source comprising a plurality of upper layer wirings, a plurality of lower layer wirings crossing the upper layer wirings and being spaced from the upper layer wirings by insulating layers, and a plurality of electron-emitting devices connected to the upper layer wirings and the lower layer wirings, respectively, said production method comprising:
    a forming step, of forming the lower layer wirings, the insulating layers, and the upper layer wirings on a substrate; and
    a removing step of, after said forming step, removing a partial region of the upper layer wiring including a region of short circuiting between the lower and upper layer wirings within a region in which the lower layer wiring crosses the upper layer wiring,
    wherein the partial region of the upper layer wiring that is to be removed extends beyond both edges of the lower layer wiring in a width direction of the lower layer wiring, but does not extend beyond at least one edge of the upper layer wiring in the width direction of the upper layer wiring,
    wherein said removing step includes performing a laser irradiation on the partial region, and
    wherein the outer edge portion of a beam spot used in performing said laser irradiation has a smaller output level than that of an inside portion of the beam spot.

7. A production method of an electron source comprising a plurality of upper layer wirings, a plurality of lower layer wirings crossing the upper layer wirings and being spaced from the upper layer wirings by insulating layers, and a plurality of electron-emitting devices connected to the upper layer wirings and the lower layer wirings, respectively, said production method comprising:
    a forming step, of forming the lower layer wirings, the insulating layers, and the upper layer wirings on a substrate; and
    a removing step of, after said forming step, removing a partial region of the upper layer wiring including a region of short circuiting between the lower and upper layer wirings within a region in which the lower layer wiring crosses the upper layer wiring,
    wherein the partial region of the upper layer wiring that is to be removed extends beyond both edges of the lower layer wiring in a width direction of the lower layer wiring, but does not extend beyond at least one edge of the upper layer wiring in the width direction of the upper layer wiring, and
    wherein said removing step is performed by means of mechanical cutting.

8. A production method of an image display apparatus comprising an electron source that comprises a plurality of upper layer wirings, a plurality of lower layer wirings crossing the upper layer wirings and being spaced from the upper layer wirings by insulating layers, and an electron-emitting device comprising a device electrode connected to each wiring in each cross point between the upper layer wiring and lower layer wiring and a phosphor member for emitting light in response to incidence of electrons emitted from the electron-emitting device,
    comprising the step of producing the electron source by means of the production method of any one of claims 1 to 5.

* * * * *

UNITED STATES PATENT AND TRADEMARK OFFICE
CERTIFICATE OF CORRECTION

| | | |
|---|---|---|
| PATENT NO. | : 7,285,428 B2 | |
| APPLICATION NO. | : 11/038276 | |
| DATED | : October 23, 2007 | |
| INVENTOR(S) | : Yoshimi Uda et al. | |

It is certified that error appears in the above-identified patent and that said Letters Patent is hereby corrected as shown below:

ON THE TITLE PAGE [75]:

Inventors, "Yoshimi Uda, Kanagawa-Ken (JP); Kazuya Ishiwata, Kanagawa-Ken (JP)" should read --Yoshimi Uda, Isehara (JP); Kazuya Ishiwata, Yokosuka (JP)--.

COLUMN 1:

Line 35, "cross sectonal" should read --cross-sectional--;
    Line 37, "are" should read --is--; and
    Line 51, "a" should read --an--.

COLUMN 2:

Line 16, "above described" should read --above-described--;
    Line 48, "cross sectional" should read --cross-sectional--; and
    Line 49, "an" should read --a--.

COLUMN 3:

Line 57, "occurred" should have --having occurred--.

COLUMN 4:

Line 14, "cross sectional" should read --cross-sectional--; and
    Line 44, "is" (both occurrences) should read --be--.

COLUMN 5:

Line 5, "above described" should read --above-described--;
    Line 45, "as" should read --as in--; and
    Line 47, "as" should read --as in--.

COLUMN 6:

Line 33, "form" should read --forms--.

UNITED STATES PATENT AND TRADEMARK OFFICE
CERTIFICATE OF CORRECTION

| | |
|---|---|
| PATENT NO. | : 7,285,428 B2 |
| APPLICATION NO. | : 11/038276 |
| DATED | : October 23, 2007 |
| INVENTOR(S) | : Yoshimi Uda et al. |

It is certified that error appears in the above-identified patent and that said Letters Patent is hereby corrected as shown below:

COLUMN 7:

Line 34, "approximate" should read --approximately--;
    Line 35, "approximate" should read --approximately--;
    Line 37, "approximate" should read --approximately--;
    Line 38, "approximate" should read --approximately--;
    Line 39, "approximate" should read --approximately--;
    Line 40, "approximate" should read --approximately--;
    Line 43, "approximate" should read --approximately--;
    Line 56, "an" (first occurrence) should read --a-- and
        "an approximate" should read --approximately--; and
    Line 57, "an" should read --a--.

COLUMN 8:

Line 2, "an" (first occurrence) should read --a-- and
        "an approximate" should read --approximately--;
    Line 3, "an" should read --a--; and
    Line 66, "in" should be deleted.

COLUMN 9:

Line 16, "(comparing" should read --(compared--;
    Line 21, "approximate" (both occurrences) should read --approximately--;
    Line 36, "believed" should read --believed to be--;
    Line 45, "than" should read --than in--; and
    Line 54, "in" should be deleted.

COLUMN 10:

Line 3, "than" should read --than in--;
    Line 10, "in" should be deleted;
    Line 52, "approximate" should read --approximately--; and
    Line 62, "taken" should read --taken as--.

UNITED STATES PATENT AND TRADEMARK OFFICE
CERTIFICATE OF CORRECTION

PATENT NO. : 7,285,428 B2
APPLICATION NO. : 11/038276
DATED : October 23, 2007
INVENTOR(S) : Yoshimi Uda et al.

It is certified that error appears in the above-identified patent and that said Letters Patent is hereby corrected as shown below:

COLUMN 11:

Line 9, "taken" should read --taken as--;
Line 14, "approximate" should read --approximately--;
Line 15, "approximate" should read --approximately--; and
Line 16, "to" should read --to that in--.

COLUMN 12:

Line 58, "1 to 5." should read --1 to 7.--.

Signed and Sealed this

Seventeenth Day of June, 2008

JON W. DUDAS
*Director of the United States Patent and Trademark Office*